(12) United States Patent
Chang et al.

(10) Patent No.: US 11,309,466 B2
(45) Date of Patent: Apr. 19, 2022

(54) LIGHT EMITTING UNIT

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Yu-Yu Chang, Taipei (TW); Chih-Yuan Chen, New Taipei (TW); Yung-Chang Jen, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 49 days.

(21) Appl. No.: 16/699,254

(22) Filed: Nov. 29, 2019

(65) Prior Publication Data
US 2020/0185580 A1    Jun. 11, 2020

(30) Foreign Application Priority Data
Dec. 5, 2018 (CN) .......................... 201811476762.3

(51) Int. Cl.
*H01L 33/60* (2010.01)
*H01L 33/38* (2010.01)

(52) U.S. Cl.
CPC ............ *H01L 33/60* (2013.01); *H01L 33/382* (2013.01)

(58) Field of Classification Search
CPC ................. H01L 33/382; H01L 33/486; H01L 33/505; H01L 33/60
See application file for complete search history.

(56) References Cited

U.S. PATENT DOCUMENTS

| | | | |
|---|---|---|---|
| 9,583,689 B2 * | 2/2017 | Lee | H01L 27/15 |
| 9,705,052 B1 * | 7/2017 | Lin | H01L 29/866 |
| 2004/0208210 A1 * | 10/2004 | Inoguchi | H01L 33/486 |
| | | | 372/36 |

(Continued)

FOREIGN PATENT DOCUMENTS

| | | |
|---|---|---|
| CN | 103137823 A | 6/2013 |
| TW | I435467 B | 4/2014 |

(Continued)

*Primary Examiner* — Mohammed Shamsuzzaman
(74) *Attorney, Agent, or Firm* — Li & Cai Intellectual Property (USA) Office

(57) ABSTRACT

A light emitting unit includes a reflective structure, a light transmitting body and a light emitting chip. The reflective structure has a recess formed by inner side surfaces thereof, and the reflective structure includes a side opening and a bottom opening corresponding to the recess. The side opening and the bottom opening are adjacent to each other, and the inner side surfaces are defined as a top surface and a surrounding side surface. The light transmitting body is disposed within the recess and doped with fluorescent powder. The light transmitting body includes a light emitting surface and an electrode exposing surface. The light emitting surface is corresponding to the side opening; and the electrode exposing surface is corresponding to the bottom opening. The light emitting chip is partially disposed within the light transmitting body and has a bottom, a top light emitting and side light emitting surfaces.

17 Claims, 19 Drawing Sheets

(56) References Cited

U.S. PATENT DOCUMENTS

| | | | | |
|---|---|---|---|---|
| 2018/0323352 A1* | 11/2018 | Takano | ................ | H01L 33/502 |
| 2019/0081221 A1* | 3/2019 | Jeon | ..................... | H01L 33/486 |
| 2019/0131500 A1* | 5/2019 | Hsieh | ..................... | H01L 33/10 |
| 2019/0296199 A1* | 9/2019 | Hashimoto | ........... | H01L 33/505 |
| 2019/0326492 A1* | 10/2019 | Marutani | ................ | H01L 33/62 |
| 2021/0028339 A1* | 1/2021 | Kojima | ............... | H01L 33/0093 |

FOREIGN PATENT DOCUMENTS

| | | |
|---|---|---|
| TW | I533062 B | 5/2016 |
| TW | I572067 B | 2/2017 |
| TW | I644056 B | 12/2018 |
| WO | 2018088851 A1 | 5/2018 |

\* cited by examiner

LIGHT EMITTING UNIT

CROSS-REFERENCE TO RELATED PATENT APPLICATION

This application claims the benefit of priority to China Patent Application No. 201811476762.3, filed on Dec. 5, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light emitting unit, and more particularly to a light emitting unit for lateral emission of light.

BACKGROUND OF THE DISCLOSURE

Since most of lateral light emitting units usually use lead frames in their structures, their volumes are several times larger than the volume of a chip, thereby hindering the development of miniaturization.

Although the LED industry has developed chip scale package (CSP) to further miniaturize LED units, at present, CSP LED units can only emit light orthogonally, and no CSP LED unit are provided particularly for lateral emission of light. To solve this problem, some manufacturers directly implement the CSP LED unit with orthogonal illuminance in a lateral direction to laterally emit light. However, the aforementioned method requires an additional process to extend its electrode to the lateral surface of the LED unit and is considered time consuming and costly. Further, the thickness of the LED unit is limited by the width of the chip, which is undesirable when wishing to achieve thinning.

SUMMARY OF THE DISCLOSURE

In response to the above-referenced technical inadequacies, the present disclosure provides a new CSP light emitting unit, such that an electrode does not have to extend to a side surface, and the thickness of the light emitting unit is not limited by the width of a chip.

In one aspect, the present disclosure provides a light emitting unit includes a reflective structure, a light transmitting body and a light emitting chip. The reflective structure has a recess formed by inner side surfaces thereof and includes a side opening and a bottom opening corresponding to the recess. The side opening and the bottom opening are adjacent to each other, and the inner side surfaces are defined as a top surface and a surrounding side surface. The light transmitting body is disposed within the recess and doped with fluorescent powder, and the light transmitting body includes a light emitting surface and an electrode exposing surface. The light emitting surface is corresponding to the side opening; and the electrode exposing surface is corresponding to the bottom opening. The light emitting chip is partially disposed within the light transmitting body and has a bottom surface, a top light emitting surface and a plurality of side light emitting surfaces that are connected to the bottom surface and the top light emitting surface, wherein the bottom surface comprises at least two electrode portions exposed from the electrode exposing surface. The light transmitting body covers a portion of the light emitting chip, and a distance from the top light emitting surface to the top surface is not less than 50 µm. The cross-section width of the recess increases toward the side opening.

In certain embodiments, the bottom surface is exposed from the electrode exposing surface.

In certain embodiments, the electrode exposing surface is semielliptical or semicircular.

In certain embodiments, the recess has a surrounding side surface and at least one section of the surrounding side surface is curved.

In certain embodiments, the electrode exposing surface is polygonal.

In certain embodiments, the electrode exposing surface is a trapezoidal surface.

In certain embodiments, a lower base of the trapezoidal surface is adjacent to the light emitting surface.

In certain embodiments, at least one base angle of the trapezoidal surface is between 60 degrees to 90 degrees.

In certain embodiments, a shortest distance between the light emitting chip and a leg of the trapezoidal surface is not less than 10 µm.

In certain embodiments, a shortest distance between the light emitting chip and the upper base of the trapezoidal surface is not less than 50 µm.

In certain embodiments, a shortest distance between the light emitting chip and the lower base of the trapezoidal surface is not less than 50 µm.

In certain embodiments, the surrounding side surface is divided into a first section surface, a second section surface and a third section surface. At least one of the first section surface, the second section surface and the third section surface reflects a light beam emitted by the light emitting chip, the light emitting chip faces a light emitting surface of the third section surface, and the shortest distance between the light emitting chip and the third section surface in a lateral direction is D5, such that an included angle θ5 and the distance D5 conform with the following relation: $D5 \geq (50\ \mu m) \times \tan(90 - \theta 5)$.

In certain embodiments, the bottom surface is flush with the electrode exposing surface.

In certain embodiments, the bottom surface protrudes from the electrode exposing surface.

One of the beneficial effects of the present disclosure is that, with the reflective structure, as a light emitting unit for lateral emission of light, the light emitting unit of the present disclosure has better luminous efficacy compared to the conventional lateral light emitting unit manufactured by chip scale package (CSP).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
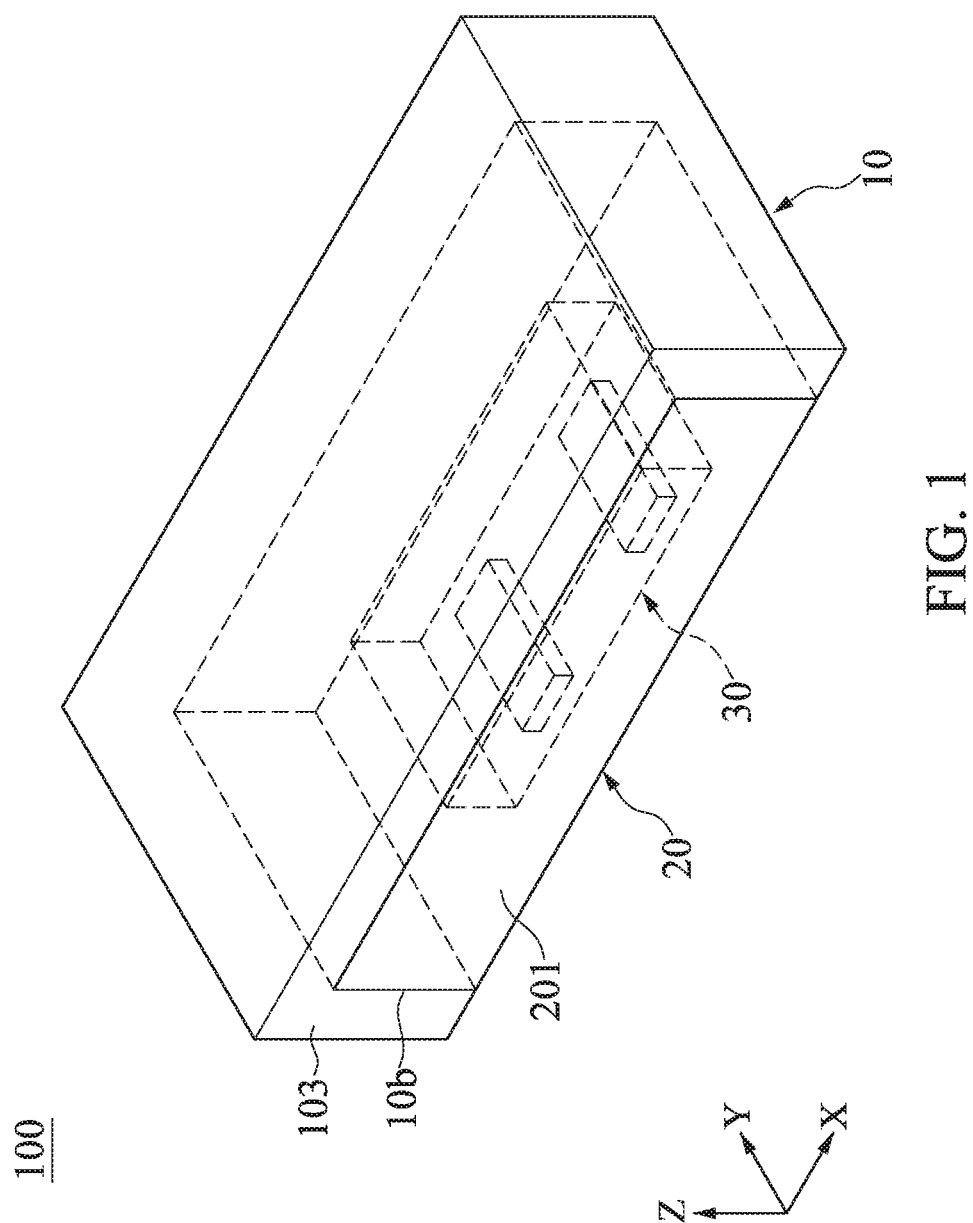
FIG. 1 is a schematic view of a light emitting unit according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
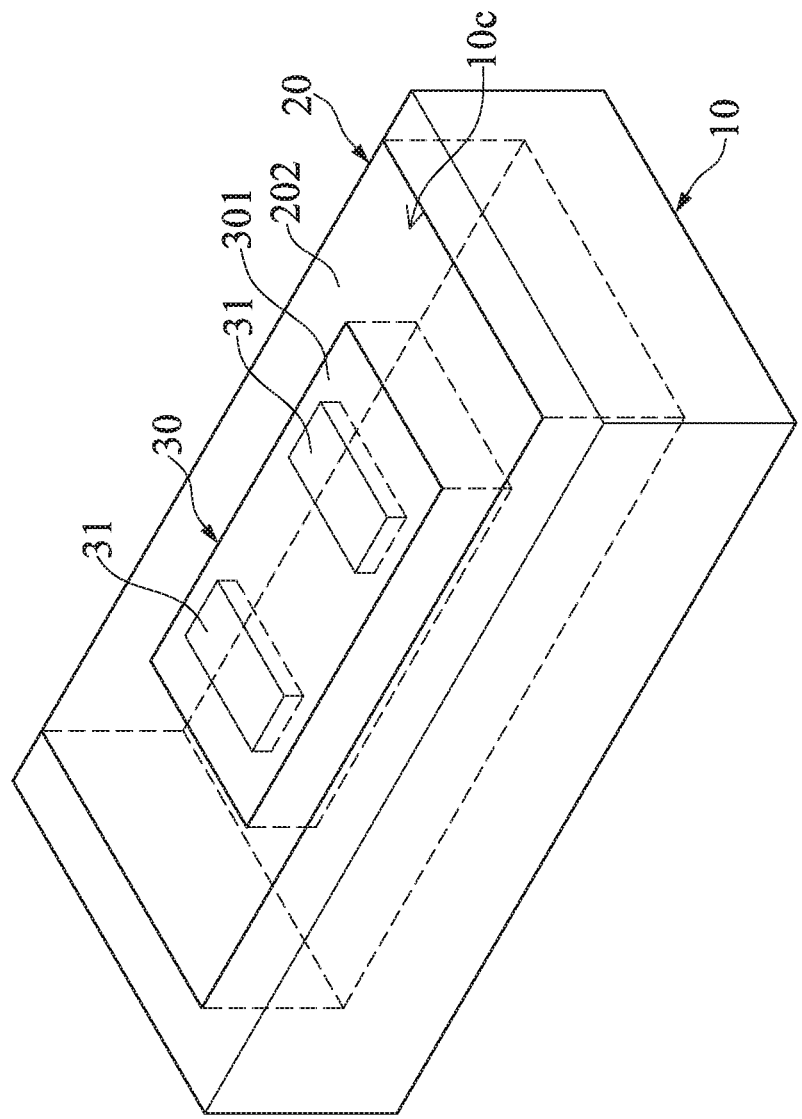
FIG. 2 is a schematic view of the light emitting unit from another angle of view according to the first embodiment of the present disclosure.
Figure 3:
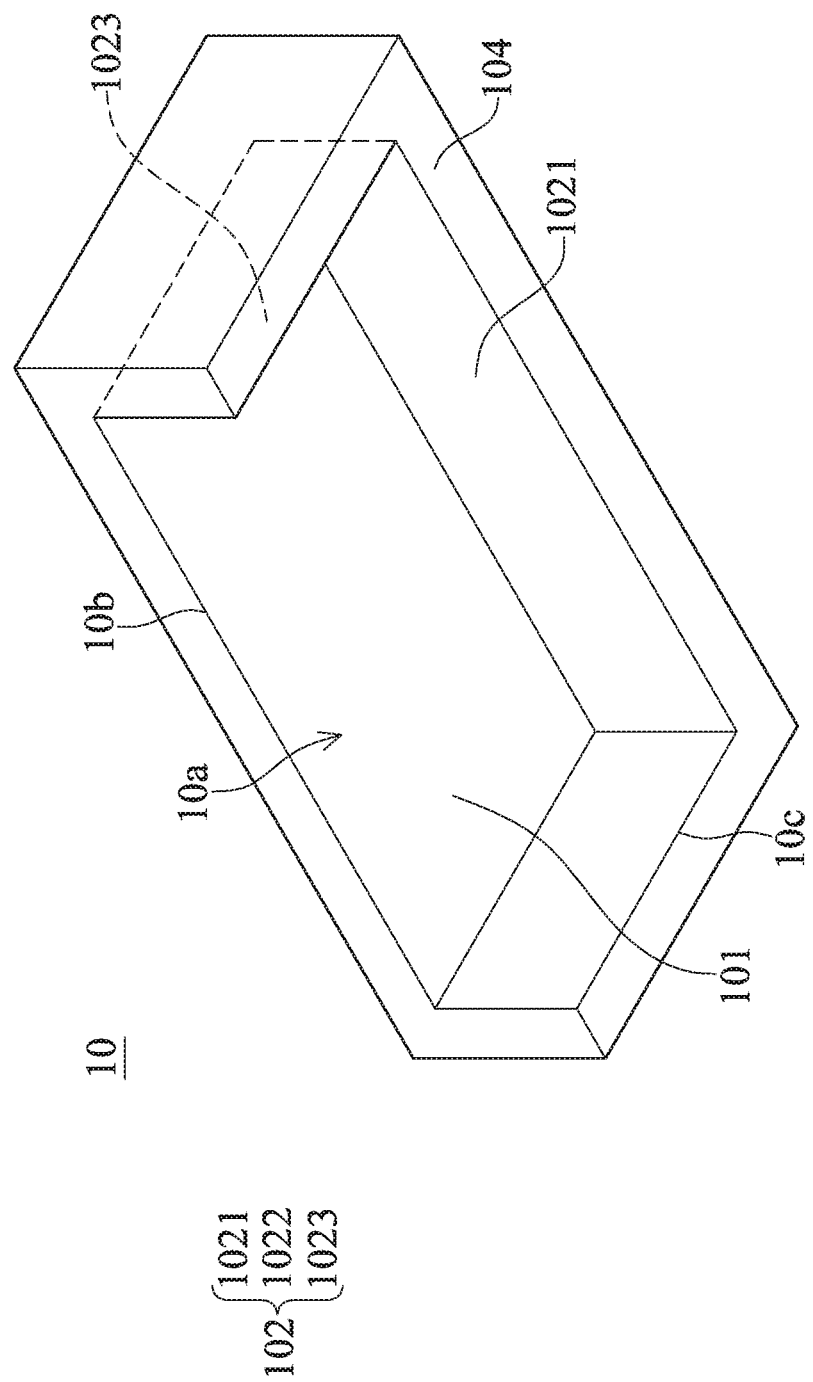
FIG. 3 is a schematic view of a reflective structure of the light emitting unit according to the first embodiment of the present disclosure.
Figure 4:
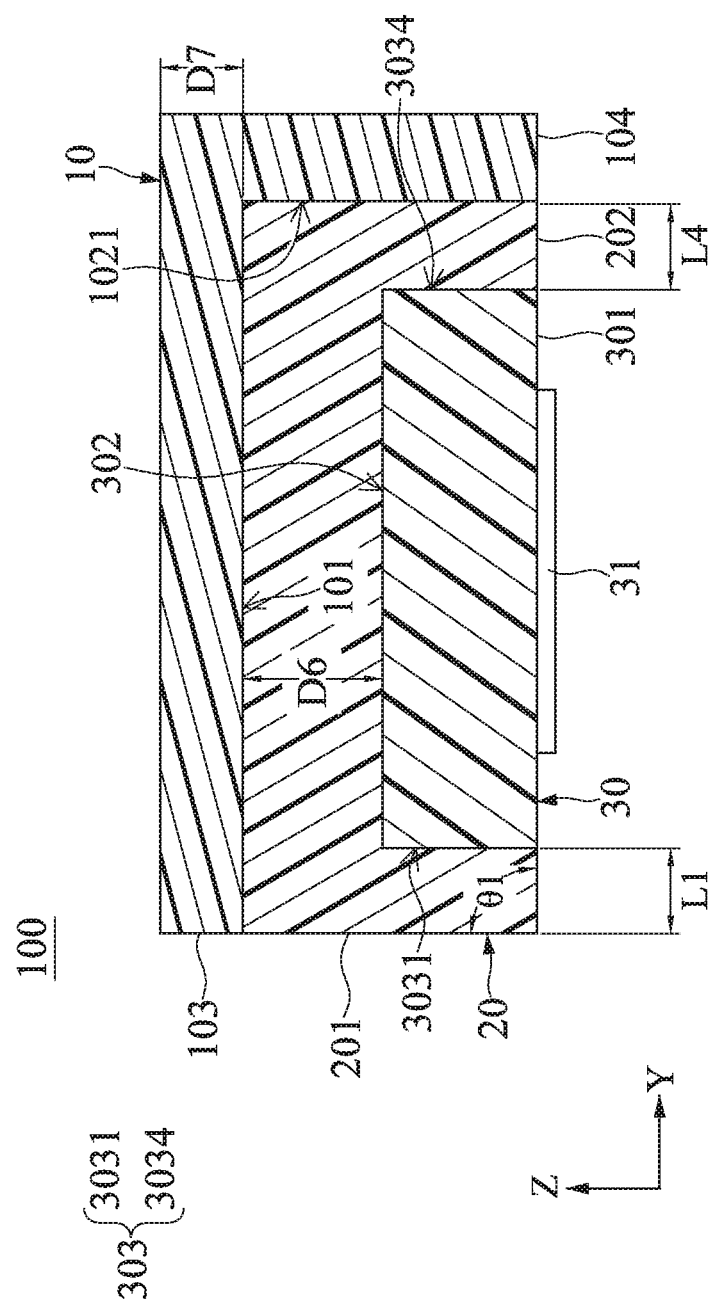
FIG. 4 is a cross sectional view of the light emitting unit according to the first embodiment of the present disclosure.
Figure 5:
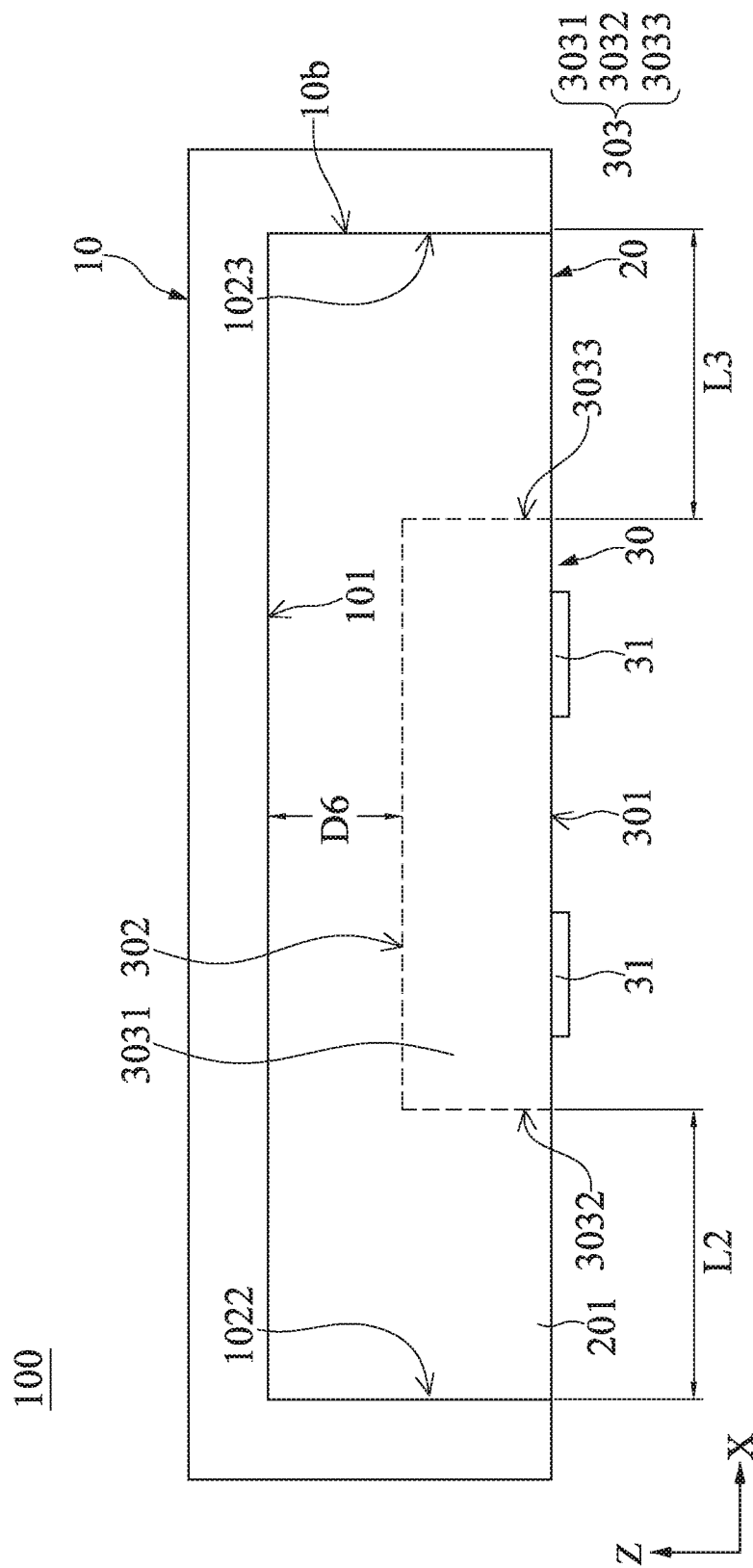
FIG. 5 is a front view of the light emitting unit according to the first embodiment of the present disclosure.
Figure 6:
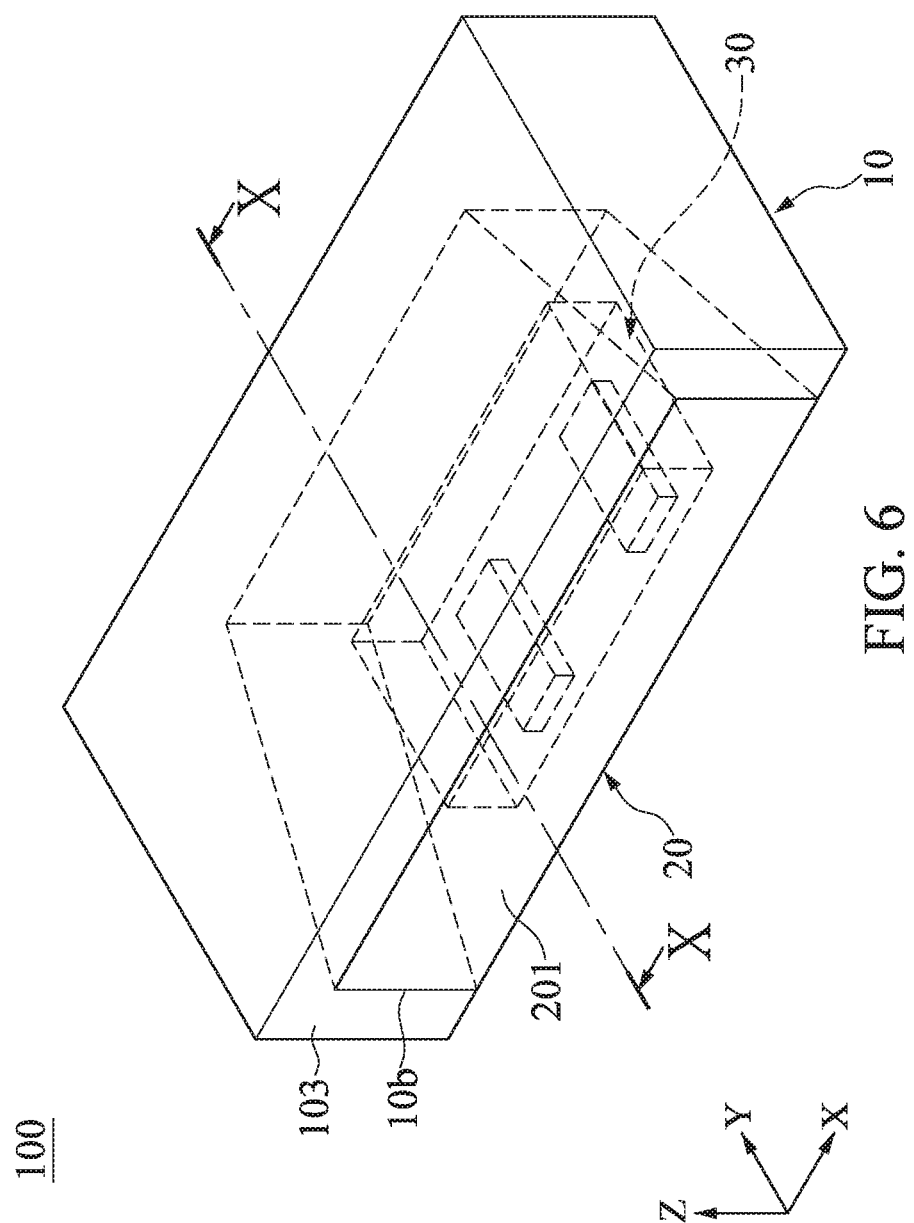
FIG. 6 is a schematic view of the light emitting unit according to a second embodiment of the present disclosure

FIG. 1 to FIG. 5 show a light emitting unit according to a first embodiment of the present disclosure. FIG. 1 is a schematic view of the light emitting unit of the present disclosure, FIG. 2 is a schematic view of the light emitting unit of the present disclosure from another angle of view, FIG. 3 is a schematic view of a reflective structure of the light emitting unit of the present disclosure, FIG. 4 is a cross sectional view of the light emitting unit of the present disclosure, and FIG. 5 is a front view of the light emitting unit of the present disclosure.

A light emitting unit 100 includes a reflective structure 10, a light transmitting body 20 and a light emitting chip 30. The reflective structure 10 covers the light transmitting body 20 and the light transmitting body 20 covers the light emitting chip 30.

In FIG. 3, two outer side surfaces of the reflective structure 10 are adjacent to each other and respectively include a side opening 10b and a bottom opening 10c. The reflective structure 10 is recessed from the side opening 10b and the bottom opening 10c toward the inside and thus a recess 10a is formed. Inner side surfaces of the reflective structure 10 forming the recess 10a comprise a top surface 101 and a surrounding side surface 102. The surrounding side surface 102 is connected to a portion of the periphery of the top surface 101.

In this embodiment, the recess 10a is approximately a rectangular cuboid and the surrounding side surface 102 is correspondingly divided into a first section surface 1021, a second section surface 1022 and a third section surface 1023. Two sides of the first section surface 1021 opposite to each other are respectively connected to the second section surface 1022 and the third section surface 1023. The first section surface 1021 is located between the second section surface 1022 and the third section surface 1023, and the first section surface 1021 is disposed approximately facing the side opening 10b.

In FIG. 1 to FIG. 3, at least one of the top surface 101, the first section surface 1021, the second section surface 1022 and the third section surface 1023 can reflect a light beam emitted by the light emitting chip 30. In practical applications, it is possible for the top surface 101, the first section surface 1021, the second section surface 1022 and the third section surface 1023 to reflect the light beam emitted by the light emitting chip 30. In different applications, it is possible that only the second section surface 1022 and the third section surface 1023 can reflect the light beam emitted by the light emitting chip 30.

In this embodiment, the first section surface 1021, the second section surface 1022 and the third section surface 1023 are flat, but are not limited thereto, and may be changed according to requirements. For example, at least one of the first section surface 1021, the second section surface 1022 and the third section surface 1023 can be a curved surface.

The light transmitting body 20 is disposed within the recess 10a, and the light transmitting body 20 has a light emitting surface 201 formed at the side opening 10b and an electrode exposing surface 202 formed at the bottom opening 10c. In practical applications, the light transmitting body 20 may be completely filled within the recess 10a but is not limited thereto. The light transmitting body 20 may be not completely filled within the recess 10a. The light transmitting body 20 described herein can be changed according to requirements (for example, the type of the light emitting chip 30), such as a transparent encapsulant, an encapsulant doped with diffusing particles, and an encapsulant doped with fluorescent powder, and is not limited thereto.

In FIG. 1 and FIG. 4, in practical applications, the light emitting surface 201 is approximately flush with an end surface 103 of the reflective structure 10 adjacent to the light emitting surface 201, but is not limited thereto. In different embodiments, the light emitting surface 201 may also be slightly retracted into the reflective structure 10 or the light emitting surface 201 may slightly protrude from the reflective structure 10. The light emitting surface 201 can be a flat surface, for example, but is not limited thereto. In a special application, the light emitting surface 201 can also be a rough surface, thereby improving the lighting uniformity.

In FIG. 1, FIG. 4 and FIG. 5, the light emitting surface 201 can be in a rectangular shape, but is not limited thereto. The appearance of the light emitting surface 201 can be changed according to requirements, such as in a trapezoid shape. The light emitting surface 201 and the electrode exposing surface 202 can be disposed approximately perpendicularly to each other, but an included angle θ1 (shown in FIG. 4) between the light emitting surface 201 and the electrode exposing surface 202 is not limited to 90 degrees, and can be greater than or less than 90 degrees. In FIG. 2, the electrode exposing surface 202 of the light transmitting body 20 can be a rectangular surface, and the size of the rectangular surface can be changed according to requirements and is not limited herein.

In FIG. 2 to FIG. 5, most of the light emitting chip 30 is covered by the light transmitting body 20. The light emitting chip 30 has a bottom surface 301, a top light emitting surface 302 and a plurality of side light emitting surfaces 303 that are connected to the bottom surface 301 and the top light emitting surface 302. The side light emitting surfaces 303 are connected to the periphery of the bottom surface 301 and the top light emitting surface 302, and the light emitting surface 303 is located between the bottom surface 301 and the top light emitting surface 302.

In FIG. 2 and FIG. 4, the bottom surface 301 of the light emitting chip 30 can be flush with the electrode exposing surface 202 and the light emitting chip 30 includes two electrode portions 31 disposed thereon. The two electrode portions 31 protrude from the bottom surface 301 and the electrode exposing surface 202. The two electrode portions 31 are electrically connected to an external circuit board so that the light emitting chip 30 can be energized and receive control signals from the outside through the electrode portions 31. The type of the light emitting chip 30 is not limited herein, and the light emitting chip 30 may be capable of emitting different colors of light beams according to requirements.

It should be noted that in practical applications, the light emitting chip 30 can be placed within the light transmitting body 20 from the electrode exposing surface 202, and a placing depth of the light emitting chip 30 is limited to the thickness of the light emitting chip 30. That is, compared to the conventional way that positions the CSP LED unit in a lateral direction, the thickness of the light emitting unit of the present disclosure is determined based on the thickness of the light emitting chip 30, such that the thickness of the entire light emitting unit can be further reduced.

In FIG. 2, FIG. 4 and FIG.5, in the embodiment, the light emitting chip 30 can be a rectangular cuboid, and the side light emitting surfaces 303 are four side light emitting surfaces correspondingly. The four side light emitting surfaces are respectively defined as a first side light emitting surface 3031, a second side light emitting surface 3032, a third side light emitting surface 3033 and a fourth side light emitting surface 3034. The first side light emitting surface 3031 faces the light emitting surface 201, and a light beam emitted by the light emitting chip through the first side light emitting surface 3031 passes the light transmitting body 20 to the outside from the light emitting surface 201.

The second side light emitting surface 3032 and the third side light emitting surface 3033 are respectively connected to two opposite sides of the first side light emitting surface 3031. The fourth side light emitting surface 3034 is opposite to the first side light emitting surface 3031, and two opposite sides of the fourth side light emitting surface 3034 are correspondingly connected to the second side light emitting surface 3032 and the third side light emitting surface 3033. Most of light beams emitted by top light emitting surface 302, the second side light emitting surface 3032, the third side light emitting surface 3033 and the fourth side light emitting surface 3034 of the light emitting chip 30 are reflected by the reflective structure 10 and emit to the outside through the light emitting surface 201. In this way, with the reflective structure 10, the light emitting unit 100 of the present disclosure can greatly improve the utilization of the light beams emitted by the light emitting chip 30, thereby improving the luminous intensity of the light emitting unit 100. It should be noted that the appearance of the light emitting unit 30 is not limited to a rectangular cuboid and can be changed according to requirements.

In FIG. 1 and FIG. 4, in practical applications, the light emitting unit 100 can be fixed to an external circuit board through the two electrode portions 31. Most of the light beams emitted by the light emitting unit 100 and passing through the top light emitting surface 302, the side light emitting surfaces 303 and the light transmitting body 20 are reflected by the reflective structure 10, and emit to the outside from the light emitting surface 201 of the light transmitting body 20. Accordingly, the light emitting unit 100 can achieve lateral light emission.

It should be noted that in FIG. 4 and FIG. 5, distances D6, L1, L2, L3, L4 among the top light emitting surface 302, the first side light emitting surface 3031, the second side light emitting surface 3032, the third side light emitting surface 3033, the fourth side light emitting surface 3034 of the light emitting chip 30 and the top surface 101, the first section surface 1021, the second section surface 1022 and the third section surface 1023 can be not less than 50 μm in practical applications. With the above distances D6, L1, L2, L3, and L4, the light beam emitted by the light emitting chip 30 has better usage efficiency and a light blending space (especially when the light transmitting body 20 is doped with fluorescent powder).

FIG. 6 to FIG. 9 are schematic views of the light-emitting unit according to a second embodiment of the present disclosure. The main difference between this embodiment and the foregoing embodiment lies in that: a cross-section width of the recess 10a extends toward the side opening 10b. Namely, the cross-section width of the recess 10a will be larger when being closer to the side opening 10b, such that the luminous efficacy of the entire light emitting unit can be improved. In other words, the recess 10a is roughly a trapezoidal cube.

Specifically, in this embodiment, the electrode exposing surface 202 of the light transmitting body 20 can be a trapezoidal surface having an upper base 2021, a lower base 2022 and two legs 2023. The upper base 2021 is disposed away from the light emitting surface 201, the lower base 2022 is disposed adjacent to the light emitting surface 201, and a width D1 of the upper base 2021 in a lateral direction (the X-axis direction shown in the drawings) is smaller than a width D2 of the lower base 2022 in the lateral direction. The two legs 2023 can be of the same length and the trapezoidal surface (electrode exposing surface 202) can be an isosceles trapezoid but the lengths of the two legs 2023 are not limited to be of the same length.

Included angles θ2 and θ3 between the upper base 2021 and the two legs 2023 are not less than 90 degrees. That is, the included angles θ2 and θ3 among the first section surface 1021, and the second section surface 1022 and the third section surface 1023 are not less than 90 degrees. In this way, after the light beams emitted by the light emitting chip 30 pass the light transmitting body 20 and are reflected by the second section surface 1022 or the third section surface 1023, most of the light beams emit toward the light emitting surface 201, thereby greatly improving the usage efficiency of the light beams emitted by the light emitting chip 30. In different applications, the included angle θ2 between the first section surface 1021 and the second section surface 1022 can be different from the included angle θ3 between the first section surface 1021 and the third section surface 1023.

Included angles θ4 and θ5 (namely, two base angles of the trapezoidal surface) between the lower base 2022 and the two legs 2023 can be less than 90 degrees. That is, the included angles θ4 and θ5 among the second section surface 1022, and the third section surface 1023 and the light emitting surface 201 are less than 90 degrees. In the embodiment where the included angles θ4 and θ5 between the lower base 2022 and the two legs 2023 are 60 degrees to 90 degrees, the usage efficiency of the light beams emitted by the light emitting chip 30 can be greatly improved.

It should be noted that in this embodiment, the electrode exposing surface 202 is a trapezoidal surface, but the appearance of the electrode exposing surface 202 is not limited thereto, and can be any polygon according to requirements, such as a pentagon and a hexagon.

A shortest distance D3 between the light emitting chip 30 and the upper base 2021 of the trapezoidal surface (the electrode exposing surface 202) can be not less than 50 μm. That is, the shortest distance D3 between the fourth side light emitting surface 3034 of the light emitting chip 30 and the first section surface 1021 is not less than 50 μm. A shortest distance D4 between the light emitting chip 30 and the lower base 2022 of the trapezoidal surface (the electrode exposing surface 202) is not less than 50 μm. That is, the shortest distance D4 between the first side light emitting surface 3031 of the light emitting chip 30 and the light emitting surface 201 is not less than 50 μm. A shortest distance D5 between the light emitting chip 30 and the legs 2023 of the trapezoidal surface (the electrode exposing surface 202) is not less than 10 μm. That is, the shortest distance D5 between the second section surface 1022 and the second side light emitting surface 3032 or between the third section surface 1023 and the third side light emitting surface 3033 is not less than 10 μm. A shortest distance D6 between the top light emitting surface 302 and the top surface 101 of the reflective structure 10 is not less than 50 μm. A minimum thickness D7 of a sidewall forming the top surface 101 is not less than 50 μm (as shown in FIG. 4 and FIG. 5). With the design of the foregoing distances, the light beams emitted by the light emitting chip 30 has better usage efficiency and a light blending space (especially when the light transmitting body 20 is doped with fluorescent powder). A shortest distance D5' between the second section surface 1022 and the second side light emitting surfaces 3032 is not less than 10 μm, and the two distances D5 and D5' can be the same or different, which is not limited.

Figure 9:
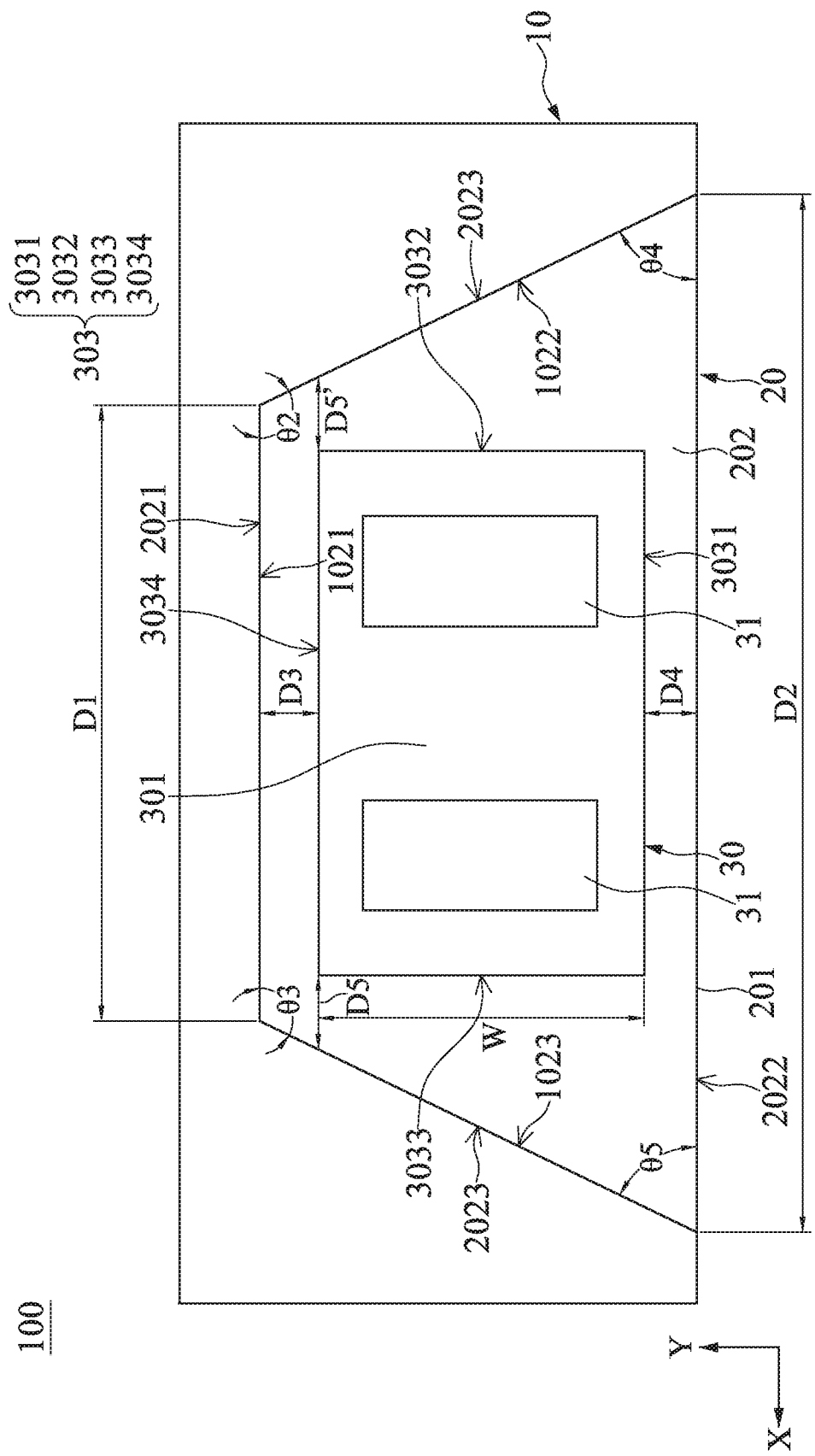
FIG. 9 is a bottom view of the light emitting unit according to the second embodiment of the present disclosure.

In FIG. 9, in the embodiment where the included angle θ4 between the second section surface 1022 and the light emitting surface 201 and the included angle θ5 between the third section surface 1023 and the light emitting surface 201 are the same, if the width of the first section surface 1021 in the lateral direction (the X-axis direction shown in the figure) is defined as D1, the width of the light emitting surface 201 in the lateral direction is defined as D2, the width of the light emitting chip 30 facing the second side light emitting surface 3032 (or the third side light emitting surface 3033) of the second section surface 1022 (or the third section surface 1023) in a longitudinal direction (the Y-axis direction in the figure) is defined as W. If the included angle θ4 between the second surface 1022 and the light emitting surface 201, the width D1 of the first section surface 1021 in the lateral direction, and the width D2 of the light emitting surface 201 in the lateral direction conform with the following relation, the light beams emitted by the light emitting chip 30 can have the best usage efficiency:

$$\frac{D2}{D1} \geq 1 + \frac{2 \times (W + 100\ \mu m) \times \tan(90 - \theta 4)}{D1}.$$

Based on the above (the included angle θ5 is equal to the included angle θ4), if the light emitting chip 30 faces the third side light emitting surface 3033 of the third section surface 1023 and the shortest distance between the light emitting chip 30 and the third section surface 1023 in the lateral direction is defined as D5, the included angle θ5 and the distance D5 between the third section surface 1023 and the light emitting surface 201 conform with the following relation:

$$D5 \geq (50\ \mu m) \times \tan(90 - \theta 5).$$

Figure 10:
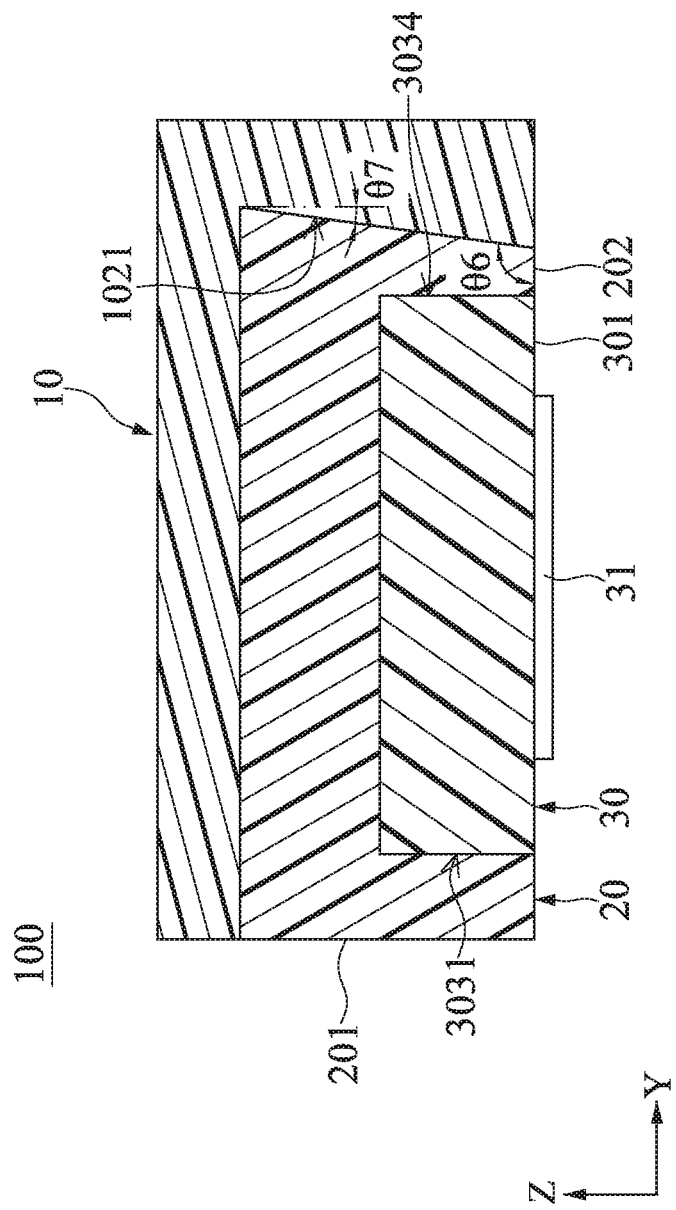
FIG. 10 is a side cross sectional view of the light emitting unit according to a third embodiment of the present disclosure.

FIG. 10 is a side cross sectional view of the light-emitting unit according to a third embodiment of the present disclosure. The main difference between this embodiment and the foregoing embodiments lies in that: an included angle θ6 between the first section surface 1021 and the electrode exposing surface 202 can be greater than 90 degrees. That is, an included angle θ7 is formed between the first section surface 1021 and a vertical line (the Y-axis in the figure). In practical applications, the included angle θ7 formed by the first section surface 1021 and the vertical line is less than 5 degrees. Based on the above, in this embodiment the light beam emitted by the fourth light emitting surface 3034 is more easily to be reflected by the first section surface 1021 and emits toward the light emitting surface 201, thereby improving the use of the light beam emitted by the light emitting chip 30.

Figure 7:
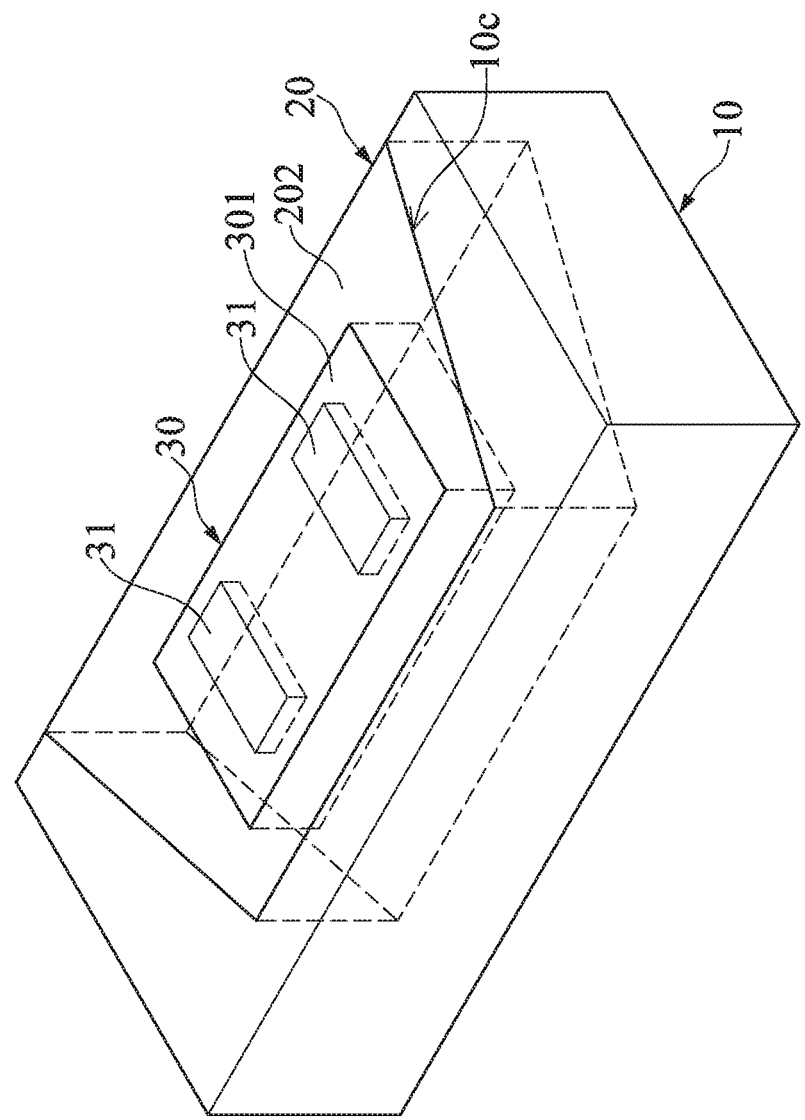
FIG. 7 is a schematic view of the light emitting unit from another angle of view according to the second embodiment of the present disclosure.
Figure 8:
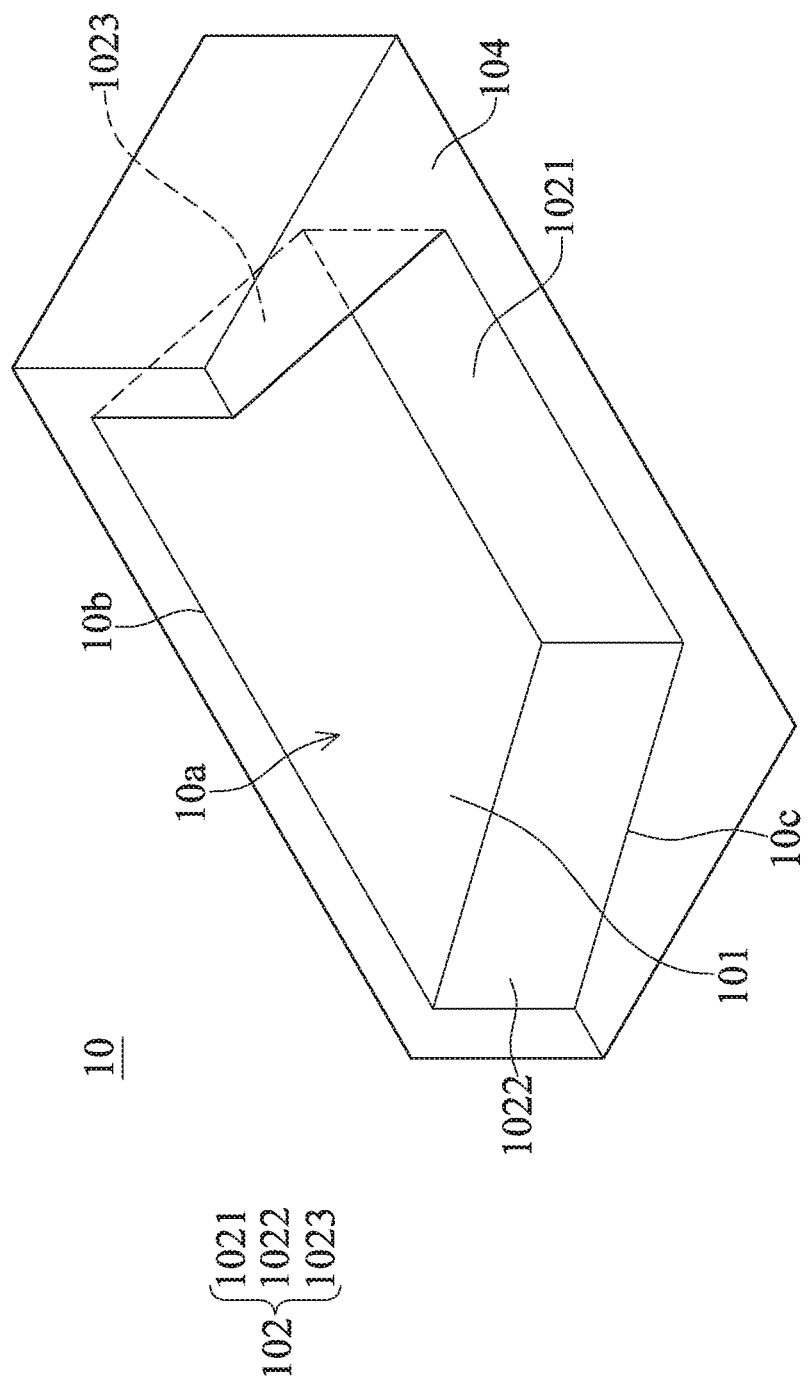
FIG. 8 is a schematic view of the reflective structure of the light emitting unit according to the second embodiment of the present disclosure.

It should be noted that referring to FIG. 2, FIG. 7 and FIG. 9, in practical applications, the amount of light output of the entire light emitting unit can be changed by changing the appearance of the recess 10a. For example, in actual measurement data, it is assumed that the entire light emitting unit in FIG. 1 has an amount of light output of 1 unit; in the embodiment in FIG. 9, if the included angles θ4 and θ5 between the leg 2023 and the lower base 2022 are 75 degrees, the amount of light output of the entire light emitting unit is 1.02 units; in the embodiment in FIG. 6, if the included angles θ4 and θ5 between the leg 2023 and the lower base 2022 are 60 degrees, the amount of light output of the entire light emitting unit is 1.12 units.

Figure 11:
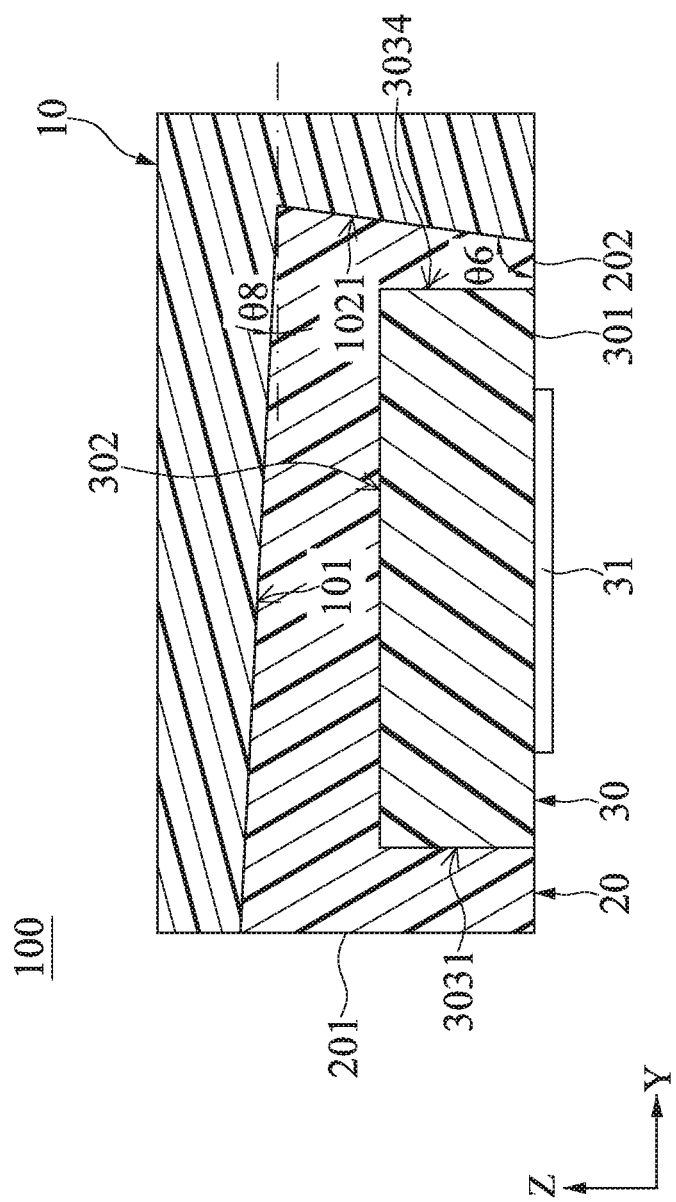
FIG. 11 is a side cross sectional view of the light emitting unit according to a fourth embodiment of the present disclosure.

FIG. 11 is a side cross sectional view of the light-emitting unit according to a fourth embodiment of the present disclosure. The main difference between this embodiment and the above third embodiment lies in that: an included angle θ8 can be formed by the top surface 101 and a horizontal line (the X-axis shown in the figure). The included angle θ8 can be designed according to requirements so that a portion of the light beams emitted by the top light emitting surface 302 can be reflected by the top surface 101 and emit toward the light emitting surface 201 to the outside (i.e. avoiding inward emission of light). It should be noted that in different applications, the first section surface 1021 can be disposed perpendicular to the electrode exposing surface 202.

Figure 12:
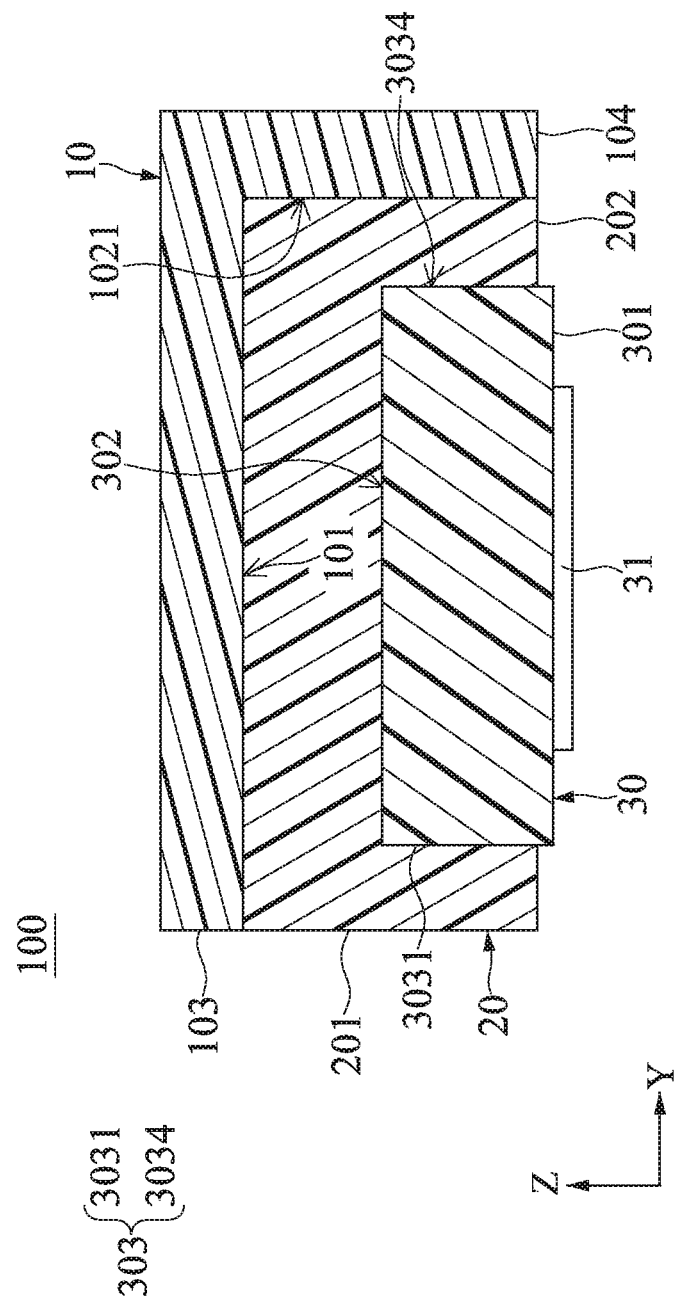
FIG. 12 is a side cross sectional view of the light emitting unit according to a fifth embodiment of the present disclosure.

FIG. 12 is a side cross sectional view of the light-emitting unit according to a fifth embodiment of the present disclosure. The main difference between this embodiment and the above embodiments lies in that: the bottom surface of the light emitting chip 30 can protrude from the electrode exposing surface 202 together with the two electrode portions 31. In this way, solders for fixing the electrode portions 31 to an external circuit board (not shown) can be accommodated among the electrode portions 31, the external circuit board and the light transmitting body, thereby enhancing the connection strength of fixing the electrode portions 31 to the circuit board and reducing the slippage of the light emitting unit 100 during reflow.

Figure 13:
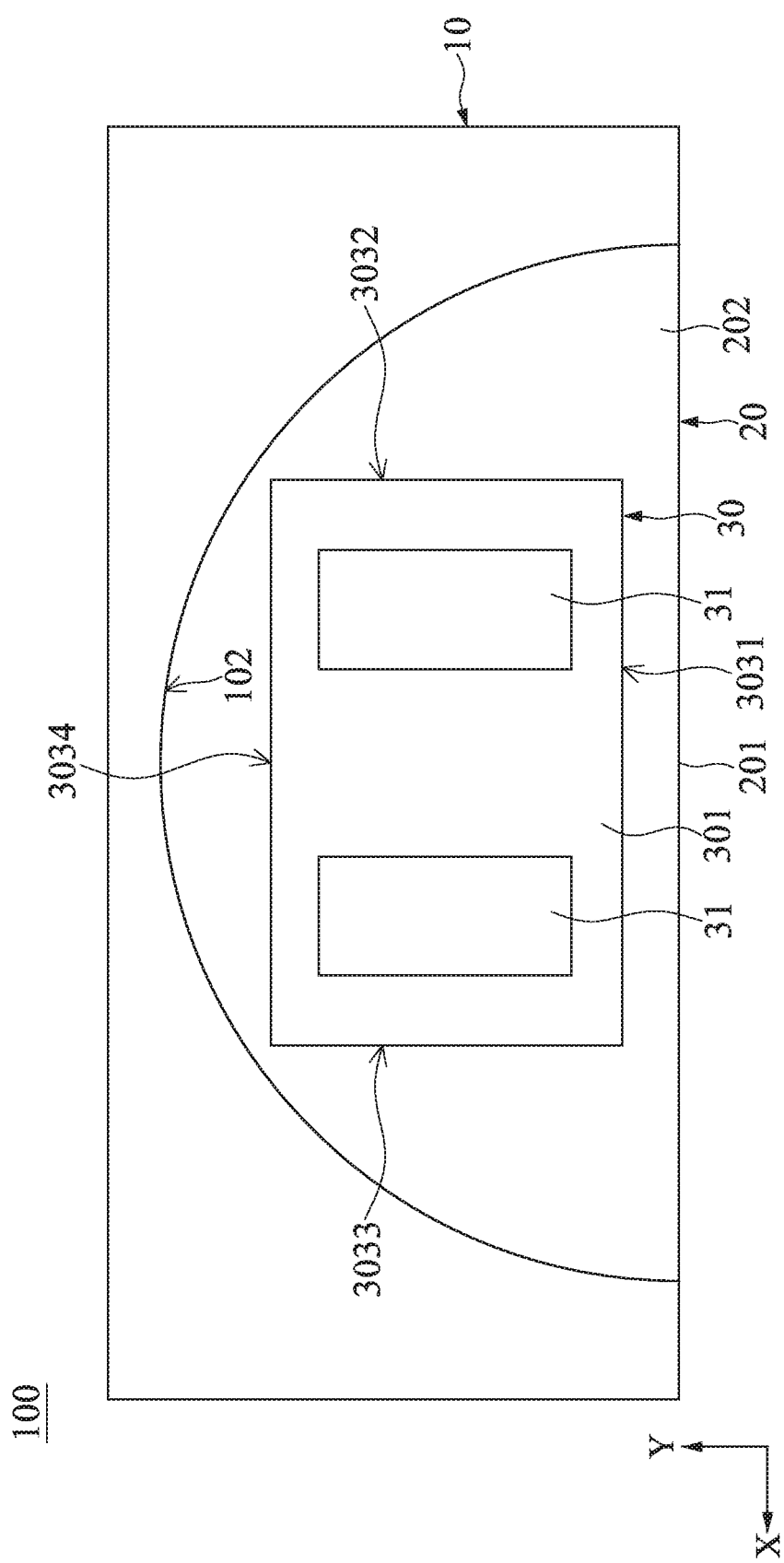
FIG. 13 is a bottom view of the light emitting unit according to a sixth embodiment of the present disclosure.

FIG. 13 is a bottom view of the light-emitting unit according to a sixth embodiment of the present disclosure. The main difference between this embodiment and the above embodiments lies in that: the surrounding side surface 102 can be a continuous curved surface and the electrode exposing surface 202 can be a semicircular surface. In practical application, the electrode exposing surface 202 can be a positive semi-circular surface, a non-positive semi-circular surface, a positive semi-elliptical surface, a non-positive semi-elliptical surface and the like, and is not limited herein.

Figure 14:
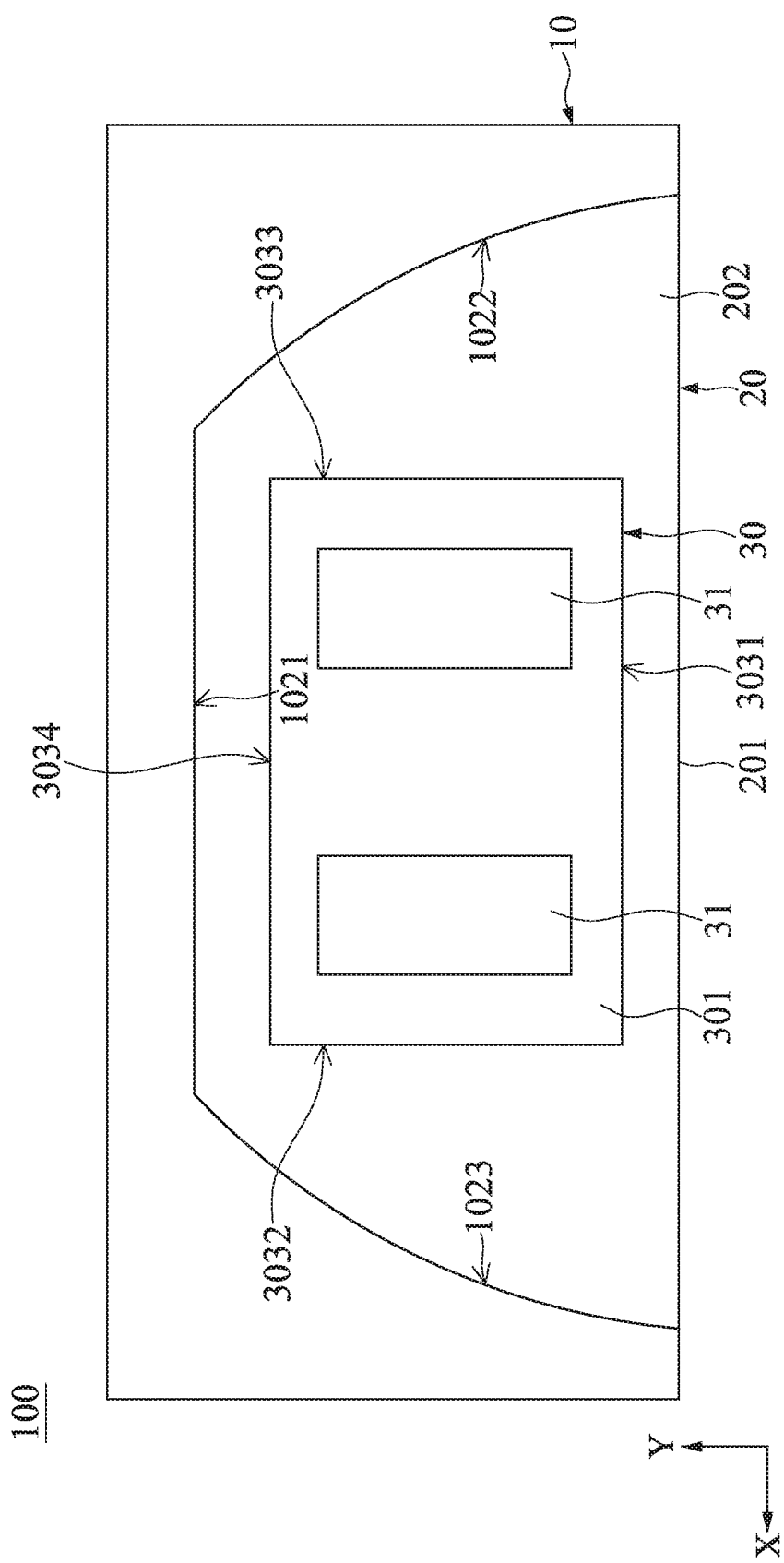
FIG. 14 is a bottom view of the light emitting unit according to a seventh embodiment of the present disclosure.

FIG. 14 is a bottom view of the light-emitting unit according to a seventh embodiment of the present disclosure. The main difference between this embodiment and the above embodiments lies in that: the first section surface 1021 is a flat surface, and the second surface 1022 and the third section surface 1023 are curved surfaces, that is, a portion of sections of the surrounding side surface 102 can be curved and another portion of the surrounding side surface 102 can be flat. The curvature of the second section surface 1022 and the third section surface 1023 can be changed according to requirements, and the second section surface 1022 can be the same or different as that of the third section surface 1023, and is not limited thereto. The length of the first section surface 1021 in the lateral direction (i.e. the X-axis direction of the coordinate system in the figure) and the length of the fourth side light emitting surface 3034 of the light emitting chip 30 in the lateral direction can be changed according to requirement and is not limited herein. In the embodiment where the length of the first section surface 1021 in the lateral direction is less than the length of the fourth side light emitting surface 3034, a portion of light beams emitted from the fourth side light emitting surface 3034 are directly reflected by the second section surface 1022 or the third section surface 1023 and emit toward the light emitting surface 201.

Figure 15:
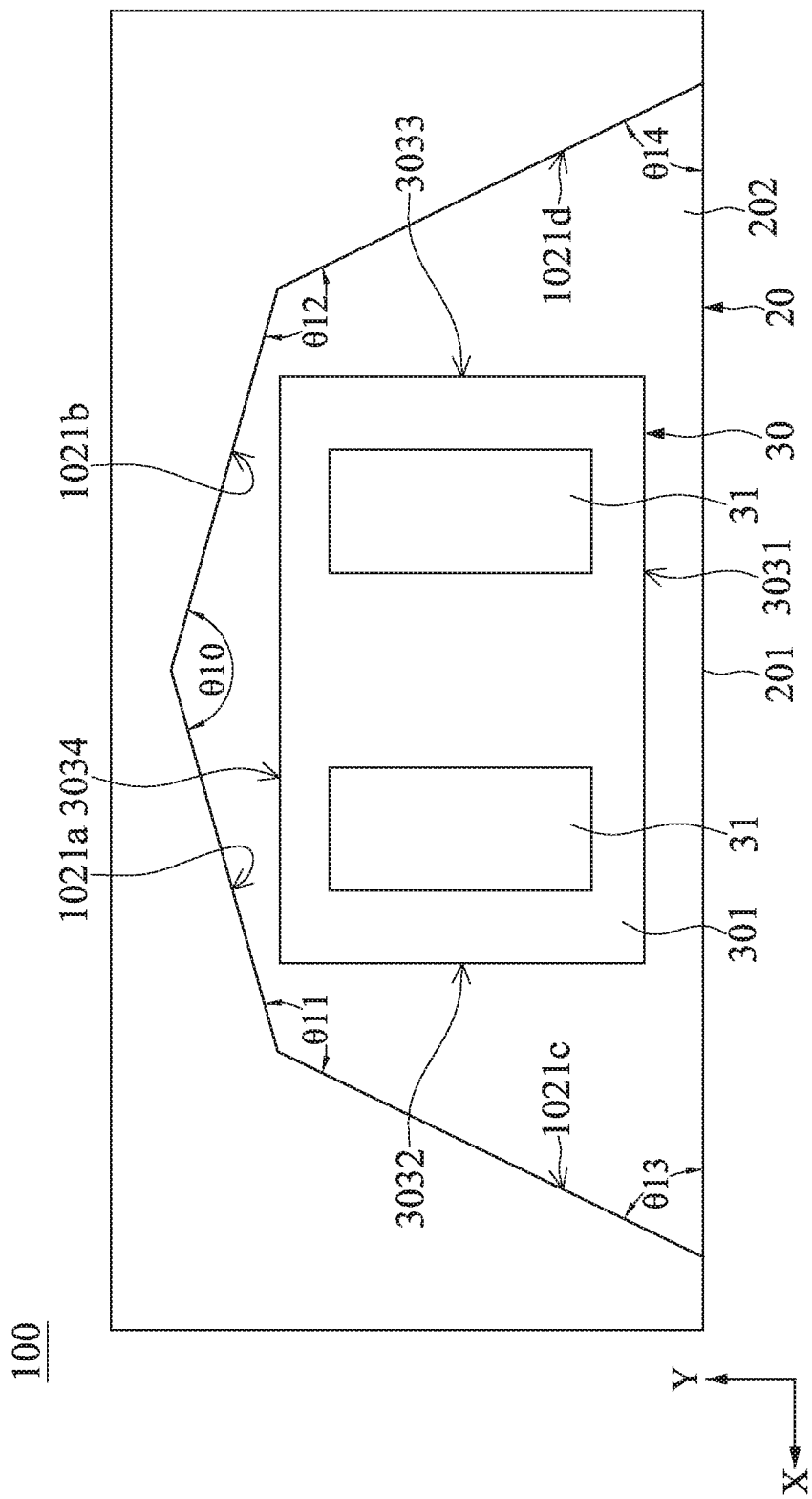
FIG. 15 is a bottom view of the light emitting unit according to an eighth embodiment of the present disclosure.

FIG. 15 is a bottom view of the light-emitting unit 100 according to an eighth embodiment of the present disclosure. The main difference between this embodiment and the above embodiments lies in that: the electrode exposing surface 202 is a pentagonal surface and the surrounding side surface 102 is correspondingly divided to a first section surface 1021a, a second section surface 1021b, a third section surface 1021c and a fourth section surface 1021d. A side of the first section surface 1021a is connected to a side of the second section surface 1021b, the first section surface 1021a and the second section surface 1021b are disposed away from the light emitting surface 201, a side of the first section surface 1021a away from the second section surface 1021b is connected to the third section surface 1021b, a side of the second section surface 1021b away from the first section surface 1021a is connected to the fourth section surface 1021d.

In the figure of this embodiment, the first section surface 1021a, the second section surface 1021b, the third section surface 1021c and the fourth section surface 1021d are flat, but is not limited thereto. In different applications, at least one of the first section surface 1021a, the second section surface 1021b, the third section surface 1021c and the fourth section surface 1021d can be a curved surface according to requirements. An included angle θ10 between the first section surface 1021a and the second section surface 1021b can be an obtuse or an acute angle depending on requirements, an included angle θ11 between the first section surface 1021a and the third section surface 1021b can be not less than 90 degrees, an included angle θ12 between the second section surface 1021b and the fourth section surface 1021d can be not less than 90 degrees, an included angle θ13 between the third section surface 1021c and the light emitting surface 201 can be not greater than 90 degrees, an included angle θ14 between the fourth section surface 1021d and the light emitting surface 201 can be not greater than 90 degrees.

Figure 16:
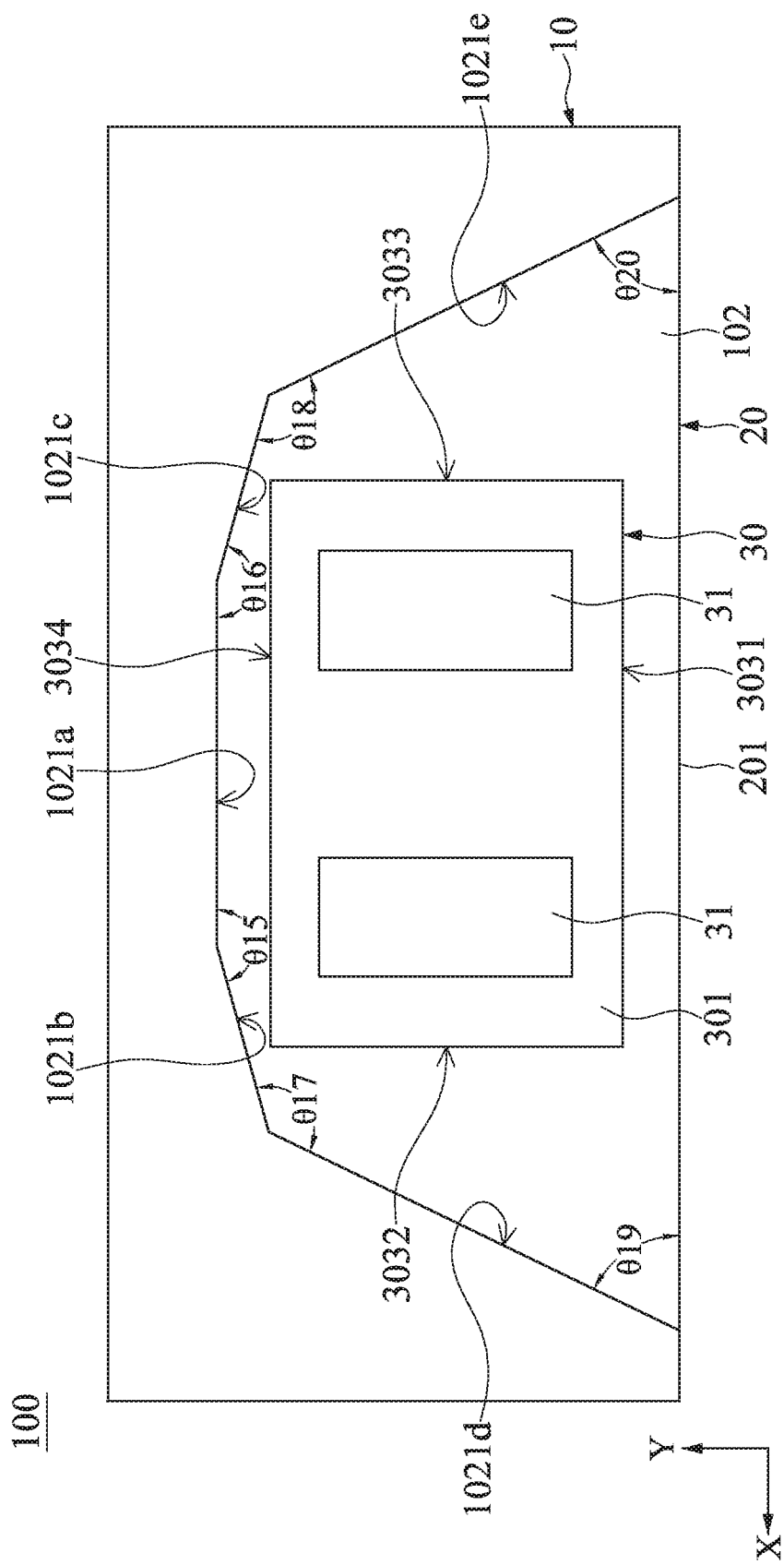
FIG. 16 is a bottom view of the light emitting unit according to a ninth embodiment of the present disclosure.

FIG. 16 is a bottom view of the light-emitting unit according to a ninth embodiment of the present disclosure. The main difference between this embodiment and the above embodiments lies in that: the electrode exposing surface 202 is a hexagonal surface and the surrounding side surface 102 is correspondingly divided to the first section surface 1021a, the second section surface 1021b, the third section surface 1021c, the fourth section surface 1021d and a fifth section surface 1021e. The first section surface 1021a faces the fourth side light emitting surfaces 3034, the second section surface 1021b and the third section surface 1021c are respectively connected to two opposite sides of the first section surface 1021a, the fourth section surface 1021d is connected to a side of the second section surface 1021b opposite to the side of the second section surface 1021b connected to the first section surface 1021a, the fifth section surface 1021e is connected to a side of the third section surface 1021c opposite to the side of the third section surface 1021c connected to the first section surface 1021a.

In a practical application as shown, included angles θ15 and θ16 between the first section surface 1021a and the second section surface 1021b or the third section surface 1021c can be greater than 90 degrees, an included angle θ17 between the second section surface 1021b and the fourth section surface 1021d is greater than 90 degrees, an included angle θ18 between the third section surface 1021c and the fifth section surface 1021e is greater than 90 degrees, an included angle θ19 between the fourth section surface 1021*d* and the light emitting surface 201 is not greater than 90 degrees, and an included angle θ20 between the fifth section surface 1021*e* and the light emitting surface 201 is not greater than 90 degrees.

Figure 17:
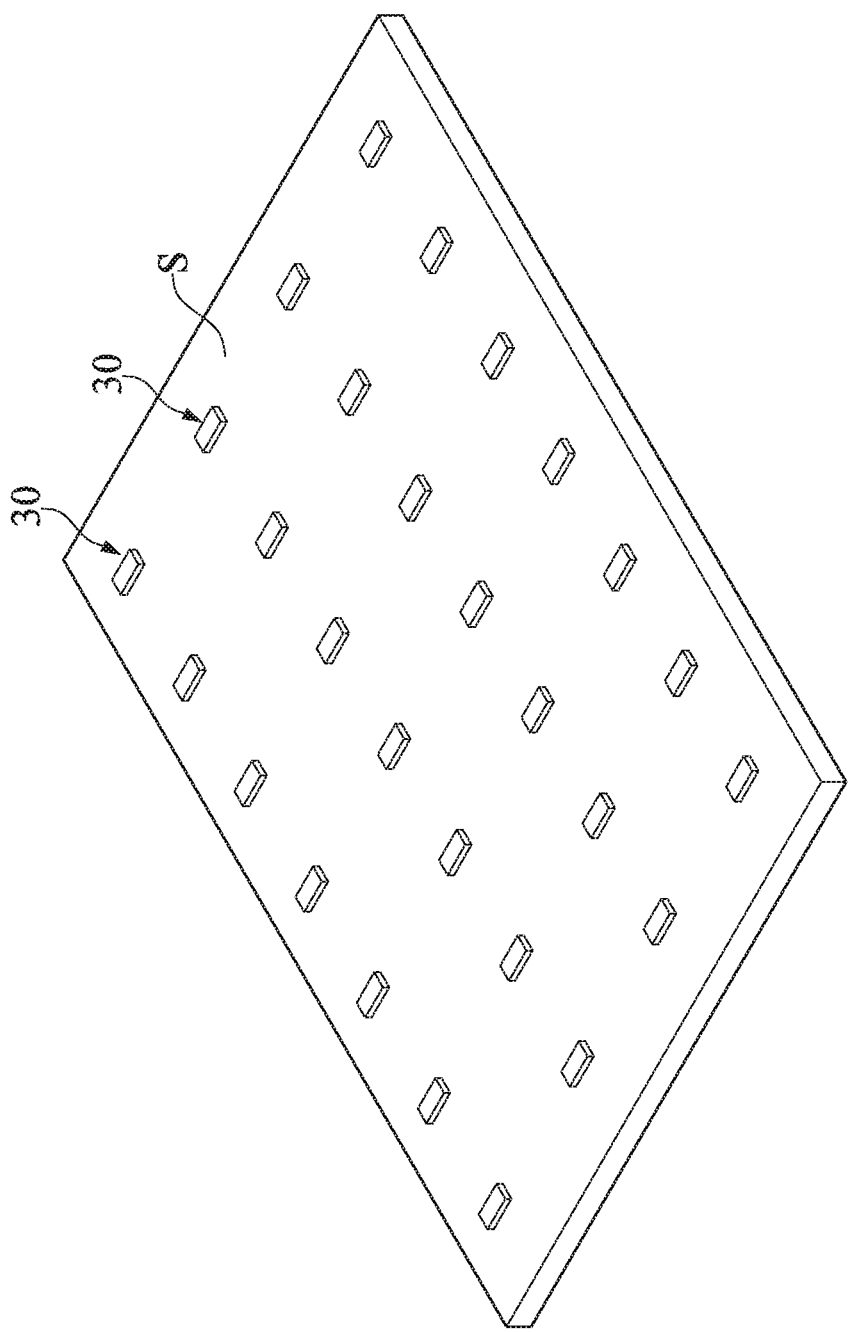
FIG. 17 to FIG. 19 are schematic views showing a manufacturing process of the light emitting unit according to the present disclosure.
Figure 18:
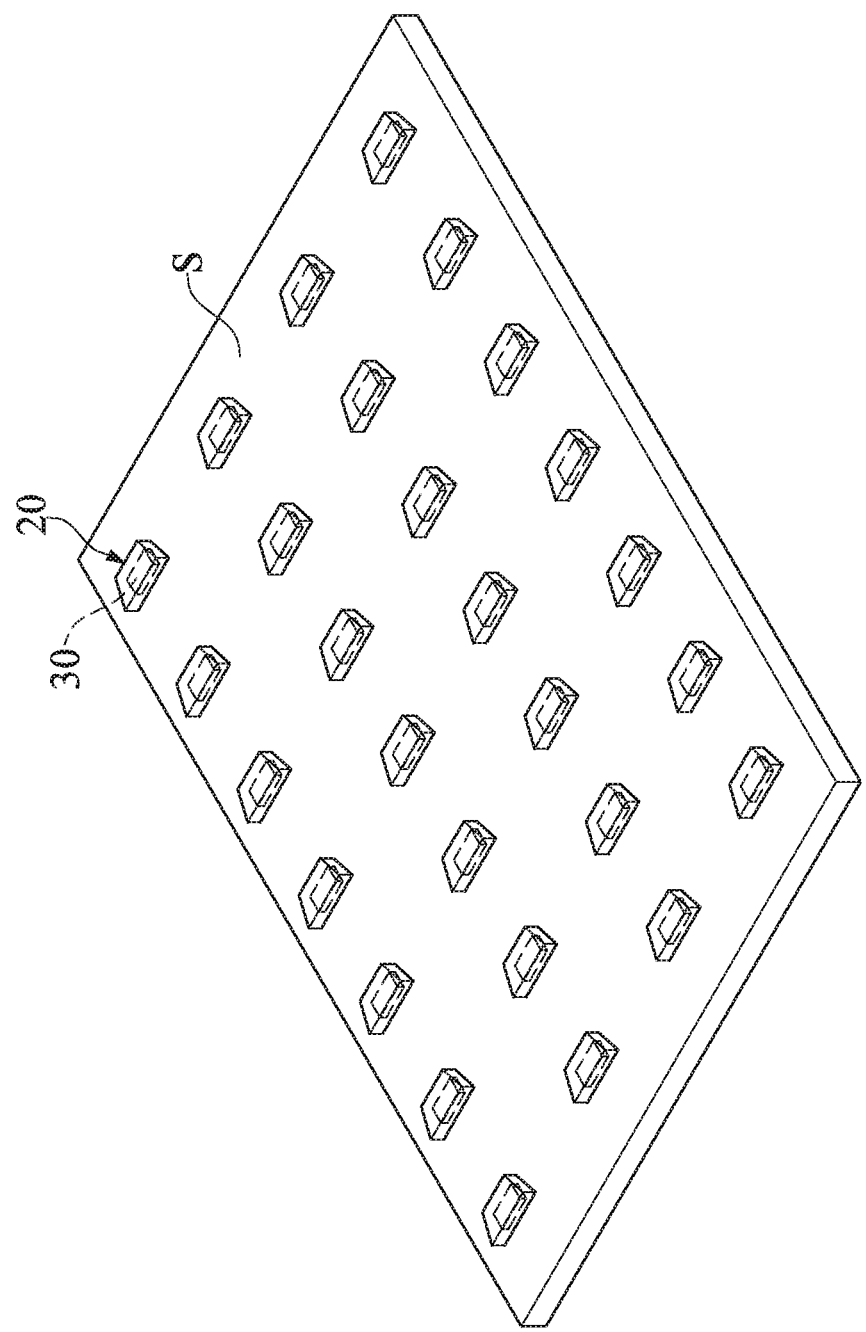
Figure 19:
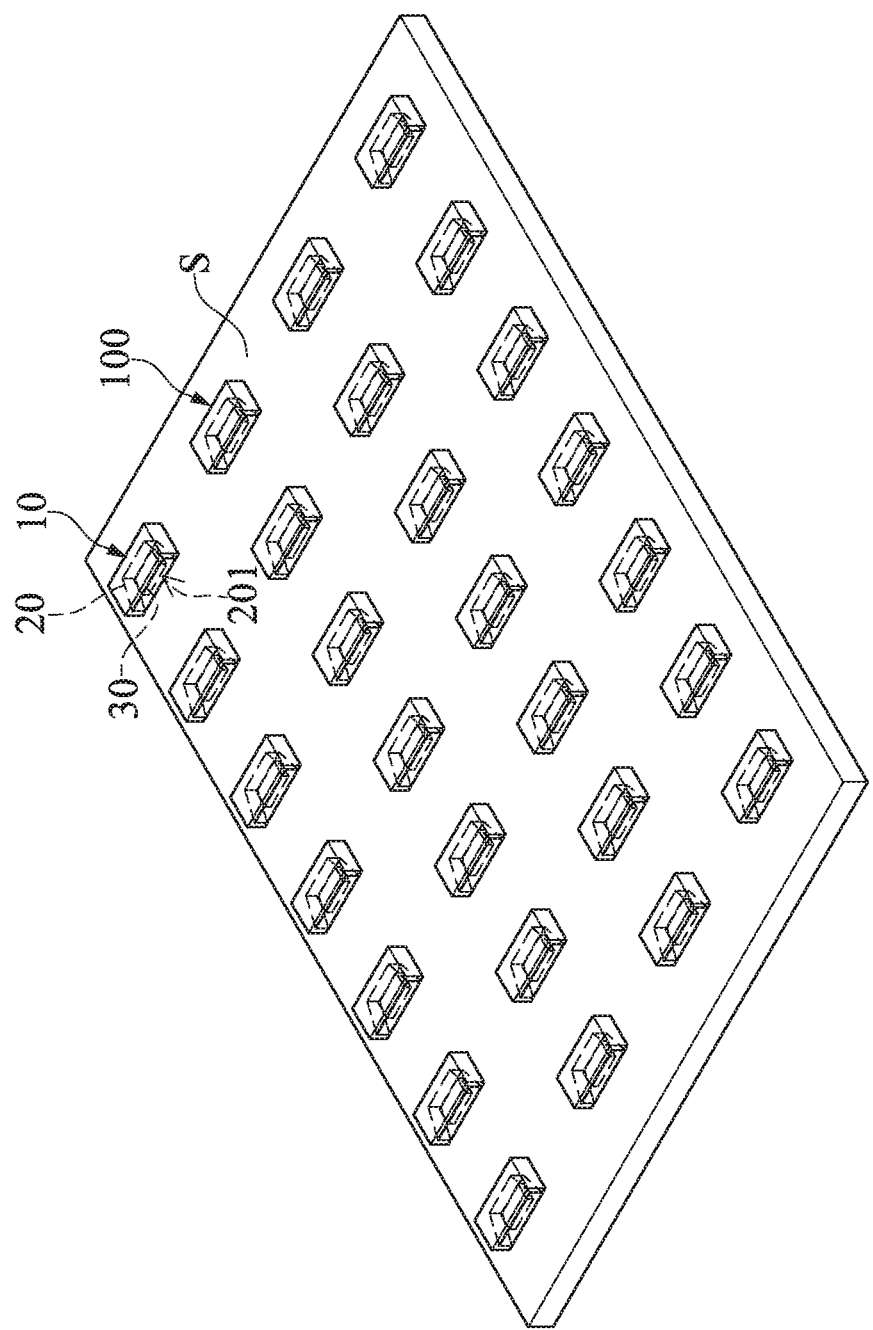

FIG. 17 to FIG. 19 are schematic views showing a manufacturing process of the light-emitting unit according to the present disclosure. In FIG. 17, the first step of manufacturing the light emitting unit 100 can be: fixing the plurality of light emitting chips 30 on a temporary carrier S. The number of the light emitting chips 30 and a distance of the two light emitting chips 30 adjacent to each other can be designed according to requirements and is not limited thereto.

In FIG. 18, the second step of manufacturing the light emitting unit 100 can be: forming the plurality of light transmitting bodies 20 on the temporary carrier S and correspondingly covering the plurality of light emitting chips 30 by the plurality of light transmitting bodies 20. In a specific application, the plurality of light transmitting bodies 20 can be directly molded and formed on the temporary carrier S by a die. Also, a continuous light transmissive layer can be formed on the light emitting chips 30 and then the plurality of light transmitting bodies 20 can be formed by cutting or die stamping. Moreover, in this embodiment, the plurality of light transmitting bodies are trapezoidal cubes, but the appearance of each of the light transmitting bodies 20 is not limited thereto, and can be the appearance described in the foregoing embodiments. In different applications, in this second step, it is possible to allow a portion of the light transmitting bodies 20 has the same appearance and allow another portion of the light transmitting bodies has different appearance. That is, in the second step, the plurality of light transmitting bodies 20 are not limited to be simultaneously formed in the same appearance.

In FIG. 19, the third step of manufacturing the light emitting unit 100 can be: forming the plurality of reflective structures 10 on the temporary carrier S, and correspondingly covering a portion of the plurality of light transmitting bodies 20 by the plurality of reflective structures 10, and a side surface (i.e. the light emitting surface 201 in the foregoing embodiments) of each of the light transmitting bodies 20 approximately perpendicular to the temporary carrier S is not covered by the reflective structure 10. The reflective structures 10 can be formed on the temporary carrier S by, for example, a die to directly form the reflective structures 10 on the light transmitting bodies 20. Also, a continuous reflective layer can be formed on the light transmitting bodies 20 and then the plurality of reflective structures 10 can be formed by cutting or die stamping. In addition, the appearance of the reflective structures 10 can be changed according to requirements. In the third step, the plurality of reflective structures 10 having the same appearance can be simultaneously formed, or a portion of the reflective structures 10 having the same appearance and another portion of the reflective structures 10 having different appearance can be simultaneously formed and is not limited thereto. The fourth step of manufacturing the light emitting unit 100 can be: cutting the temporary carrier S to form the plurality of light emitting units 100.

Based on the above, the light emitting unit 100 of the present disclosure is a light emitting unit for lateral light emission. With the reflective structure 10, the use of the light beams emitted by the light emitting chip 30 can be greatly improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting unit, comprising:
a reflective structure having a recess formed by inner side surfaces thereof, and the reflective structure including a side opening and a bottom opening corresponding to the recess, wherein the side opening and the bottom opening are adjacent to each other, and the inner side surfaces are defined as a top surface and a surrounding side surface, and wherein the reflective structure is recessed from the side opening and the bottom opening toward the inside and thus the recess is formed;
a light transmitting body disposed within the recess and doped with fluorescent powder, and comprising:
a light emitting surface corresponding to the side opening; and
an electrode exposing surface corresponding to the bottom opening; and
a light emitting chip partially disposed within the light transmitting body and having a bottom surface, a top light emitting surface and a plurality of side light emitting surfaces that are connected to the bottom surface and the top light emitting surface, wherein the bottom surface comprises two electrode portions exposed from the electrode exposing surface;
wherein the light transmitting body covers a portion of the light emitting chip, and a distance from the top light emitting surface to the top surface is not less than 50 µm;
wherein a cross-section width of the recess increases toward the side opening.

2. The light emitting unit according to claim 1, wherein the bottom surface is exposed from the electrode exposing surface.

3. The light emitting unit according to claim 1, wherein the electrode exposing surface is semielliptical or semicircular.

4. The light emitting unit according to claim 1, wherein the recess has a surrounding side surface, and at least one section of the surrounding side surface is curved.

5. The light emitting unit according to claim 1, wherein the electrode exposing surface is polygonal.

6. The light emitting unit according to claim 1, wherein the electrode exposing surface is a trapezoidal surface.

7. The light emitting unit according to claim 6, wherein a lower base of the trapezoidal surface is adjacent to the light emitting surface.

8. The light emitting unit according to claim 6, wherein at least one base angle of the trapezoidal surface is between 60 degrees to 90 degrees.

9. The light emitting unit according to claim 6, wherein a shortest distance between the light emitting chip and a leg of the trapezoidal surface is not less than 10 μm.

10. The light emitting unit according to claim 6, wherein a shortest distance between the light emitting chip and an upper base of the trapezoidal surface is not less than 50 μm.

11. The light emitting unit according to claim 6, wherein a shortest distance between the light emitting chip and a lower base of the trapezoidal surface is not less than 50 μm.

12. The light emitting unit according to claim 6, wherein the surrounding side surface is divided into a first section surface, a second section surface and a third section surface, at least one of the first section surface, the second section surface and the third section surface reflects a light beam emitted by the light emitting chip, the light emitting chip faces a light emitting surface of the third section surface, and a shortest distance between the light emitting chip and the third section surface in a lateral direction is D5, such that an included angle θ5 and the distance D5 conform with the following relation:

$$D5 \geq (50\ \mu m) \times \tan(90 - \theta 5).$$

13. The light emitting unit according to claim 12, wherein the electrode exposing surface is an isosceles trapezoidal surface.

14. The light emitting unit according to claim 12, wherein the bottom surface is flush with the electrode exposing surface.

15. The light emitting unit according to claim 12, wherein the bottom surface protrudes from the electrode exposing surface.

16. The light emitting unit according to claim 12, wherein an included angle of the first section surface is less than 5 degrees.

17. The light emitting unit according to claim 12, wherein the light emitting surface is a rough surface.

* * * * *